United States Patent
Suthoff (10) Patent No.: US 6,644,036 B2
(45) Date of Patent: Nov. 11, 2003

(54) COOLING DEVICE

(75) Inventor: Burkhard Suthoff, Rheine (DE)

(73) Assignee: Pfannenberg GmbH, Hamburg (DE)

( * ) Notice: Subject to any disclaimer, the term of this patent is extended or adjusted under 35 U.S.C. 154(b) by 0 days.

(21) Appl. No.: 10/149,260

(22) PCT Filed: Dec. 23, 2000

(86) PCT No.: PCT/EP00/13267

§ 371 (c)(1), (2), (4) Date: Aug. 27, 2002

(87) PCT Pub. No.: WO01/50074

PCT Pub. Date: Jul. 12, 2001

(65) Prior Publication Data

US 2003/0029172 A1 Feb. 13, 2003

(30) Foreign Application Priority Data

Dec. 23, 1999 (DE) .......................................... 199 63 571

(51) Int. Cl.⁷ ................................................. F25B 21/00
(52) U.S. Cl. ............................................................ 62/3.1
(58) Field of Search ............................................ 62/3.1

(56) References Cited

U.S. PATENT DOCUMENTS

| | | | |
|---|---|---|---|
| 5,312,514 A | 5/1994 | Kumar | |
| 5,675,972 A | * 10/1997 | Edelson | 62/3.1 |
| 5,699,668 A | * 12/1997 | Cox | 62/3.1 |
| 5,974,806 A | * 11/1999 | Pekola et al. | 62/3.1 |
| 6,089,311 A | * 7/2000 | Edelson | 165/104.23 |
| 6,172,448 B1 | * 1/2001 | Pais et al. | 313/46 |
| 6,332,331 B1 | * 12/2001 | Cheng et al. | 62/275 |

FOREIGN PATENT DOCUMENTS

| | | |
|---|---|---|
| DE | 3254244 | 6/1961 |
| DE | 2550966 | 5/1976 |
| DE | 3730830 | 3/1989 |
| EP | 0404093 | 12/1990 |

OTHER PUBLICATIONS

"Boiling Fridges", New Scientist Planet Science, Jan. 24, 1998; Retrieved from the Internet; Apr. 24, 2001.

* cited by examiner

Primary Examiner—William C. Doerrler
(74) Attorney, Agent, or Firm—Friedrich Kueffner (57) ABSTRACT

The invention relates to a novel cooling system (100) in which waste heat to be dissipated is first absorbed by an electron emission layer (15). The heat induces a discharge of electrons (13) from the surface of the electron emission layer, whereby the electrons are drawn off by a suction electrode (10) which is located on a positive potential located opposite the emission layer (15). The thermal energy carried along by the electrons (13) induce a heat transfer from the electron emission layer (15) to the suction electrode (10). The intensity of the electron flow can be controlled by the bias voltage of a grid (12) which is arranged between the electron emission layer (15) and the suction electrode (10). The surface of the electron emission layer (15) is preferably composed of alkaline earth metals such as barium or cesium.

14 Claims, 5 Drawing Sheets

COOLING DEVICE

FIELD OF APPLICATION

This invention refers to a cooling device, a method for cooling an object as well as to a cooling system which is appropriate in particular for switch cupboards.

PRIOR ART

By heat we understand an energy which exists in form of irregular atomic or molecular movements. Since on the basis of the second main thermodynamics theorem, the entropy (disorder) of a system can only increase or remain the same, for all practical transformations of an energy type into another energy type, a generation of heat does take place, whereby this heat energy is lost for the transformed useful energy. Thus, the effort is made to maintain this "waste heat" as low as possible or to avoid that it does develop at all. However, because of the physical or thermodynamic regularities, such efforts to avoid waste heat are subject to theoretical limits which cannot be exceeded. Therefore, it is unavoidable that for many practical processes waste heat develops which is to be dissipated as efficiently as possible in order to guarantee the operation of the corresponding system.

An important example for waste heat generating processes consists in electrical processes as they appear in electrotechnical installations, switchboards, electric circuits or microelectronic components. Because of friction processes of the electrons which carry the electric line, a power loss which is proportional to the resistance R and to the second power of the power loss developing as waste heat. The waste heat results, as explained in the introduction, in an increase of the kinetic energy of the atoms and molecules or in an increase of their oscillation amplitude in the solid-state grid.

For cooling objects, various methods are known which are fundamentally based on the principle that a cooler object (heat sink) is connected with a warmer object (source of heat) in such a way that, by reason of the thermodynamic tendency to take on a state of equilibrium, heat energy flows over from the source of heat to the heat sink. The transfer of heat energy can take place on the one hand by conduction of heat by which, at a microscopic level, the movement energy of the atoms or of the molecules is transferred by shock processes from one particle to the other. The rate with which heat energy is transferred by conduction of heat is proportional to the contact surface participating in the thermal conductibility $\lambda$ as well as to the temperature gradient (temperature difference per interval) between the source of heat and the heat sink.

A further mechanism for the transport of waste heat is the convection. Here, the waste heat is first transferred to a movable medium such as for example a cooling liquid and then carried-off with the matter of this cooling medium. The speed with which this carrying-off takes place is determined by the rate of motion of the cooling medium and can thus reach relatively high values.

Finally, a further mechanism for the dissipation of waste heat consists in the reradiation of heat energy in form of electromagnetic heat radiation. The transport speed of the heat energy is the light velocity, whereby the rate of the heat dissipation according to the Stefan Bolzmann law is proportional to the reradiating surface as well as to the fourth power of the temperature difference. This means that in particular for high temperature differences between the source of heat and the heat sink a high rate of heat dissipation can be achieved through reradiation.

For the carrying-off of waste heat as it develops, for example, for electronic components in switch cupboards, the matter is to carry off the waste heat quickly and safely away from the place of origin. Otherwise, it can come namely to a overheating and thus to a destruction of electronic components. Thus, for example, ventilation devices are used in which a strong fan blows cooling air along the surface of the components and thus ensues a quick carrying-off of heat by convection. Furthermore, it is known to apply large surface cooling bodies made of metal on components to be cooled such as, for example, microprocessors, whereby these cooling bodies should assure a quick transmission of the loss heat from the place of origin and the transfer thereof to the convection cooling. For these known solutions, it is disadvantageous that they require considerable constructional efforts with mechanically moved components which are highly subject to wear. Furthermore, the efficiency of such devices often leaves much to be desired and the cooling systems are connected with the use of substances which are harmful to the environment.

Aim, Solution, Advantage

The aim of this invention was to make available a novel cooling device which should be cheap, long wearing, as maintenance-free and simple as possible to construct without being harmful to the environment. Furthermore, the cooling device should guarantee a high efficiency for a cooling capacity also at low temperatures, preferably to −80° C., and should be adapted to different technical general conditions. Moreover, it should be possible to operate the cooling device as autonomously as possible with batteries or accumulators.

The cooling device according to the invention contains accordingly an electron emission layer which is to be applied to the object to be cooled, furthermore a suction electrode placed at a distance from the electron emission layer as well as a source of voltage, the negative pole of which is connected with the electron emission layer and its positive pole with the suction electrode.

The cooling device transports the waste heat to be carried-off with the aid of electrons. Normally, electrons are bound inside a solid by chemical bonds for certain atoms or molecules. However, for many solids such as in particular metals, by reason of quantum-mechanical level superpositions, there develop (energetic) conduction bands in which the valency electrons can move freely inside the solid. Such valency electrons also transport heat energy with their energy of movement and moreover are the carriers of the electric current conduction when an electric source of voltage is connected with the solid. The space of motion of the valency electrons is substantially limited to the inside of the solid. In the solid, there are electrons in a so-called potential well which they can only leave when they carry along a correspondingly high energy of movement which allows them to overcome the potential stage at the surface of the solid. The energy necessary for the electrons of the upper valence band of a solid for leaving the solid is designated as activation energy and constitutes a matter constant. Since, by reason of the statistical distribution of heat energy in a solid, a few electrons always have a very high energy which lies over the activation energy, a few electrons always can leave the solid. This means that such a solid is surrounded by an "electron cloud" in direct vicinity of the surface. The quantitative description of the flow of the released electrons ensues by the so-called Richardson effect equation. For temperatures around 20° C., the released electrons typically cover distances with a velocity of approximately 3500 m/s.

This invention now uses this effect of the electrons which are released for the dissipation of waste heat. In order to achieve this aim, the electron emission layer is provided which is to be connected with the object to be cooled. Eventually, the electron emission layer can also be configured as a part of the object to be cooled itself. The electron emission layer first absorbs—for example over heat conduction—waste heat from the object to be cooled. This heat energy is stored among others in the valency electrons of the electron emission layer. Thus, the fraction of the high energy electrons which overcome the activation energy and which thus can leave the electron emission layer rises. The discharged electrons carry along the inherent kinetic energy from the electron emission layer. In other words, they draw off energy from this layer. Without further measures, it would hower quickly come to a state of equilibrium between the electron cloud and the electron emission layer, i.e. that per unit of time exactly as many electrons would come out the electron emission layer than electrons from the electron cloud would come back into the electron emission layer. Thus, a net dissipation of heat energy could not take place. In order to interrupt this equilibrium and in order to assure a continuous carrying-off of heat energy from the electron emission layer, according to the invention the suction electrode is provided for at a distance of the electron emission layer. By feeding a source of voltage between the suction electrode (anode) and the electron emission layer (cathode), a potential drop is generated between the two electrodes which draws the discharged electrons to the suction electrode. The electrons are taken over then into the solid matter of the suction electrode and led to the source of voltage. The electrons are thus continuously removed from the electron cloud around the electron emission layer so that a discharge of high-energy electrons from the electron emission layer effectively takes place. As already explained above, the electrons move then with a very high velocity of typically 3500 m/s so that an extremely quick heat transport takes place from the electron emission layer, which is connected as a cathode according to the polarity of the source of voltage, to the suction electrode which is connected as an anode.

The advantages of the cooling device according to the invention are to be found in an efficient and quick transport of waste heat. This transport takes place without expensive constructional measures and without the use of movable mechanical parts so that also practically no wear can take place and the device can be operated maintenance-free for a long time, typically ten years. A further advantage of the cooling according to the invention is that it works absolutely silently and practically does not require any additional space for cooling elements.

In a further development of the invention, a grid is placed between the electron emission layer and the suction electrode, this grid being connected with a preferably adjustable source of voltage. The potential course can be varied by such a grid on the way between the electron emission electrode and the suction electrode and can be adjusted at will so that the flow of the high-energy electrons from the electron emission layer to the suction electrode can be regulated. To this aim, a voltage negative with respect to the electron emission layer is applied to the grid, this voltage acting repulsively onto the electrons of the electron cloud around the electron emission layer. The grid thus controls the potential course on the way between the electron emission layer and the suction electrode. The electrode current is controlled with the aid of the Coulomb's forces in order to prevent a water formation inside the cooling space. Moreover, it is thus possible to configure variably the cooling capacity according to the technical requirements. Instead of a grid, a multiple grid can also be used in order to improve the control. Thus, the grid prevents the passage of the positive voltage of the suction electrode (anode) to an extent which can be adjusted by the negative voltage at the grid. An electric power draw of the grid itself does not take place. In this way, the cooling capacity of the cooling device can be exactly adapted to the respective needs. In particular, it can be avoided that at the beginning of a cooling process a too high cooling capacity develops which could result in an icing of the object to be cooled, or of the electron emission layer.

According to a further configuration according to the invention, the surface of the electron emission layer can contain an alkaline earth metal, preferably cesium (Cs) or barium (Ba) or electrides or mixtures thereof or be entirely made of these substances. For alkaline earth metals, the activation energy is comparatively low so that already a few electron volt (eV) are sufficient to release electrons for a heat transport. Electrides are special salts which have a very loose bond of the valency electrons, what again contributes to an easy availability of the heat transporting electrons.

Furthermore, said substances can be placed preferably on a layer which contains tungsten (W) or which is made thereof. A combination of alkaline earth metals with tungsten or with comparable elements results in a further reduction of the activation energy and thus in an easier release of the electrons necessary for the heat transport.

According to a further improvement of the invention, the surface of the electron emission layer has a surface profile shaping, for example a three-dimensional structure, which is created by forming recesses (ridges, grooves, channels). However, any other conformation of the surface structure is also conceivable when it achieves the purpose to increase the size of the contact surface between the electron emission layer and the environment so that the rate of the discharged electrons increases correspondingly. In the same way as the electron emission layer is provided with a surface profile shaping, the surface of the suction electrode can be provided with a profile shaping on its side turned to the electron emission layer.

Preferably, a vacuum is produced between the electron emission layer and the suction electrode. This vacuum assures that the free distance covered by the electrons is sufficiently big so that they can fly without collisions with gas atoms or gas molecules from the electron emission layer to the suction electrode. Such a vacuum thus considerably contributes to the increase of the heat transmission velocity and efficiency.

According to a further development of the cooling device according to the invention, this cooling device contains a device for generating a magnetic field in the area of the surface of the electron emission layer. Such a magnetic field acts positively and with a directing effect onto the movement of the electrons which induce the heat transfer. Because of the Lorentz force, the electrons move in a magnetic field on circuits or loops around the magnetic field lines. For a magnetic field directed preferably vertically to the surface of the electron emission layer, this magnetic field thus results in that movement components of the electrons directed tangentially to the surface are deviated to circular orbits. On the other hand, movements of the electrons vertically to the surface of the electron emission layer (i.e. in direction of the magnetic field) are not influenced by the magnetic field. In this manner, the electrons discharged from the electron emission layer are held quasi captured over the surface, whereby however their movement vertically to the surface and thus to the suction electrode is not impaired. Furthermore, with the aid of the magnetic fields, the discharge energies of the elements such as, for example, barium can be reduced by a few electron volt so that discharge energies of less than 1,0 eV can be obtained.

According to a further development of the invention, the electron emission layer contains radioactive elements which undergo a β-decay (β-emitter). Electrons are spontaneously released by the β-decay so that electrons are still available in the electron emission layer even, due to low temperatures, there are not enough thermally activated electrons. A safety cooling can thus also be realized in case of lack of beam potential at the suction electrode.

The electron emission layer can also be configured as a thin-layer film on a highly conductive material, preferably on gold. Such an electrically and thermally conductive material assures a good transport of the waste heat inside the electron emission layer.

Finally, in a further development of the suction electrode, the suction electrode can show projecting parts such as, for example, edges which make possible a discharge of the electrons from the hot electron emission layer and make available the shortest way from the cathode to the anode.

Furthermore, the invention relates to a method for cooling an object which is characterized in that an electron emission layer is placed on the object and a suction electrode at a distance to this electrode emission layer and that the electron emission layer is applied opposite to the suction electrode to a negative electric potential. This means that the electron emission layer is operated as a cathode and the suction electrode as an anode. Due to the method according to the invention, a cooling can take place in the way explained above in the context of the cooling device, cooling by which electrons transport thermal energy from the electron emission layer to the suction electrode. The surface properties become positively apparent on the electron emission layer. Since namely the "hot" electrons remain particularly often at the surface and the bonding force at the surface is reduced compared to the inside of the solid, it is very likely that these electrons leave the surface and move to the suction electrode. When leaving the solid, the electrons carry along their energy of movement as individual thermal energy. This causes a temperature reduction of the electron emission layer. The energy transported by the electrons arrives to the anode which slowly heats up. Therefore, it is generally necessary to cool the anode (suction electrode) with other methods which can be more conventional. However, it is important there that a quick and efficient carrying-off of heat takes place from the critical components, such as for example microprocessors or electronic circuits, so that the heat can then be further distributed and carried-off from the suction electrode under less critical conditions. The suction electrode can be cooled in particular by a separate Peltier effect or a thermoacoustical effect.

The flow of the electrons from the electron emission layer to the suction electrode is controlled by an electric potential which is applied to a grid placed between the electron emission layer and the suction electrode. Due to such an electric potential, the intensity of the electron flow from the electron emission layer to the suction electrode can be controlled powerless. A further degree of freedom is thus obtained which can be used for a manual or automatic control depending on the situation.

Furthermore, the invention relates to a cooling system which contains a secondary cooling which can be realized in particular in form of a convection cooling (for example by air or water). The cooling system is characterized in that it contains a cooling device of the above explained type to be applied on the object to be cooled, the suction electrode of which is cooled by the secondary cooling. Such a cooling system can be used for example in switch cupboards of electric components in which, due to electric currents, there raises a high volume of waste heat which is to be carried-off from the place of origin as quickly as possible for protecting the components. However, the cooling system can also be advantageously used for many other heat producers such as, for example, for light generators. dr

BRIEF DESCRIPTION OF THE DRAWINGS

The invention will be described below with an example with reference to the annexed drawings.

DETAILED DESCRIPTION OF THE INVENTION AND BEST WAY FOR CARRYING OUT THE INVENTION

Figure 1:
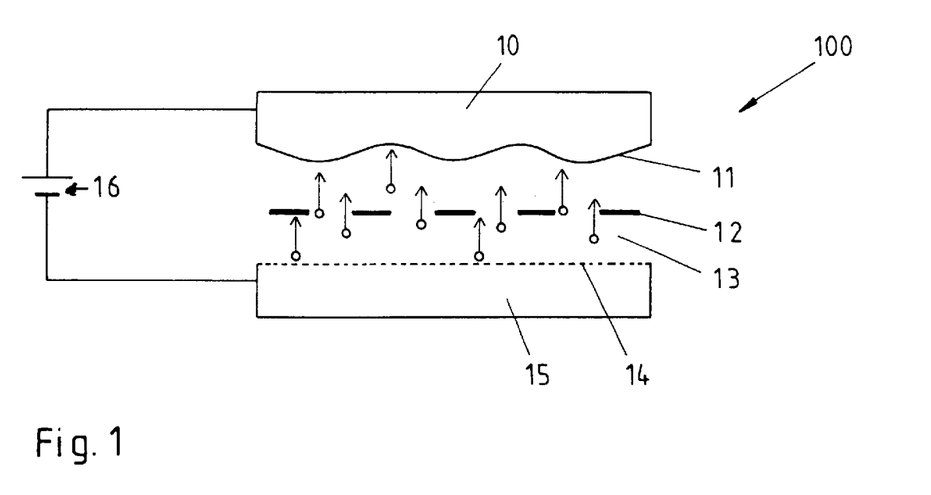
FIG. 1 shows a schematic representation of the function principle of the invention.

FIG. 1 schematically shows the function principle of the cooling device according to the invention 100. Waste heat arising on an object to be cooled (not represented) is absorbed by the electron emission layer 15. The heat energy is absorbed in particular by the electrons of the material so that a few electrons receive a sufficiently high energy to leave the surface of the electron emission layer 15. These electrons surround the surface of the electron emission layer 15 as a charge cloud. According to the invention, a suction electrode 10 is placed at a distance of the surface of the electron emission layer 15 and a negative potential (cathode) is fed over a source of voltage, for example a battery 16, to the electron emission layer 15 and a positive potential (anode) is fed to the suction electrode 10. Due to this potential difference, electrons 13 from the charge cloud are sucked around the electron emission layer 15 to the suction electrode 10. The electrons carry along each time a part of the heat energy of the electron emission layer to the suction electrode 10 over their kinetic and potential energy. This heat is carried-off from the suction electrode 10 by secondary cooling measures (which are not represented). The flow of the electrons 13 from the electron emission layer 15 to the suction electrode thus assures a heat transport which takes place without mechanically moved parts and which is thus long wearing and silent, whereby it however simultaneously takes place with a high efficiency and a high velocity. The flow of the electrons 13 can be controlled according to the needs over a grid 12 or a multiple grid, placed between the electron emission layer 15 and the suction electrode 10, to which a negative potential (with respect to the electron emission layer 15) is fed.

The heat arriving onto the anode 10 heats it up. This heat in turn can still first activate the cathode by radiation additionally to the loss heat existing anyway so that a more intense electron emission is released which can result in an explosive cooling. This process can be controlled over the grid 12 when a corresponding negative bias voltage at the grid throttles the electron flow for reducing the cooling capacity.

Moreover, the dammed up heat can be transformed into electric energy. This can take place for example in form of scintillations of barium and a glass guide, whereby the light is guided to a photocell which transforms it into electric energy. This electric energy can be stored and can be usefully transformed into cold, for example by Peltier elements.

Further advantages of the cooling according to the invention consist in that it does not require any use of substances which are detrimental to the environment, that is makes possible cooling capacities to −80° C., that it is appropriate for an operation with batteries and that it can be flexibly adapted to different technical conditions. Rough estimations show that a cooling device according to the invention could be operated at costs of approximately 0,98 dollar per watt. The cooling capacity lies by 4 Watt per square centimeter and the expenses for the material lie by 0,3 kilogram per Watt. With the cooling method according to the invention, there is no noise development. The cooling cell can be adapted to the technical needs, i.e. several cells can be joined to a block. The device has a compact structure and a low weight. The accuracy of the temperature adjustment is guaranteed and the desired cooling capacity can be achieved quickly and without inerty effect.

Preferably a vacuum is situated in the space between the electron emission layer 15 and the suction electrode 10. A corresponding vacuum technique is necessary for making available this vacuum.

For an improvement of the invention, the discharge of electrons can also be supported by light. To this purpose, photosensitive dopants must be integrated in the layers besides the alkaline earth metals. Photodiodes would then already be able to release the line transport of quick electrons in the cooling device.

Furthermore, sandwich films are also conceivable. Such films would mean an unrestricted adaptation to heating rooms to be cooled. The vacuum gap could be realized with thick glass cells in small size which would have weld-in conductive wires.

The electron emission layer 15 and/or the suction electrode 10 is represented with a structured surface 14, the three-dimensionsal conformation of which results in an increased effective surface and thus in an increased discharge of electrons from the inside of the material. The configuration of the structural cathode surfaces can be made in particular by vaporization matrices.

In a similar way, the surface of the suction electrode 10 is provided with a suction profile shaping 11. This profile shaping is to be selected so as to support the suction of the electrons from the electron emission layer 15.

The suction electrode 10 absorbs the heat transferred by the electrons 13. Therefore, a conventional cooling of the suction electrode 10 is to be cared for. In particular energy transforming elements can be used here which transform the heat energy of the suction electrode 10 preferably into useful energy such as, for example, electric energy as far as this is possible by reason of the physical regularities.

The thermally active layer on the electron emission layer contains preferably alkaline earth metals such as barium or cesium. Since the alkaline earth metals all react very aggressively to water and oxygen, a certain expenditure of technique is necessary for manufacturing these layers.

Figure 2:
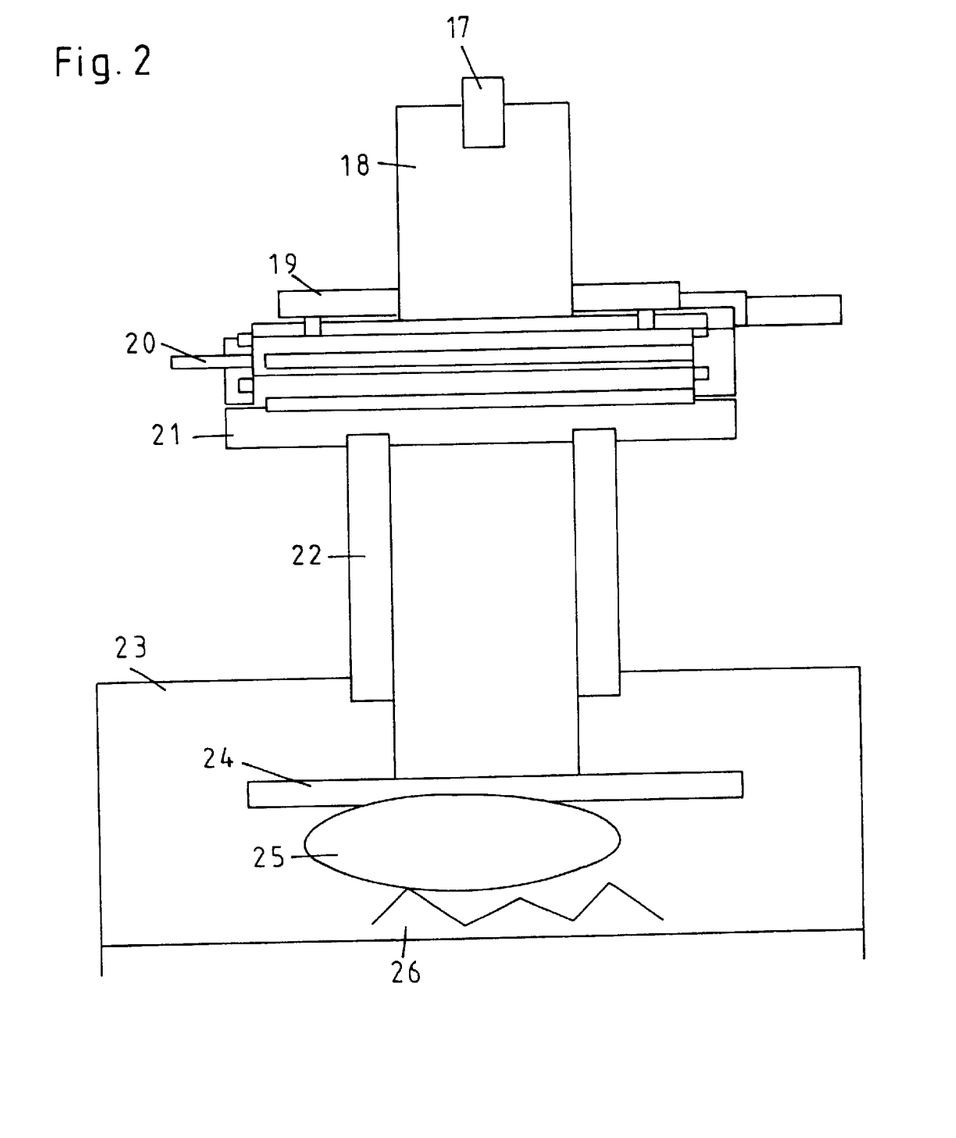
FIG. 2 shows a cooling system according to the invention.

In FIG. 2, the structure of a concrete cooling device is represented schematically. A source of heat 26 is in a reaction space 23, this source of heat generating a heat field 25. The reaction space can be in particular a switch cupboard. The waste heat is first absorbed by a heat collecting surface 24 which serves as an electron emission layer and delivers electrons to the suction electrode. The suction electrode is connected with the reaction space 23 by a heat conducting body 22 and a closable vacuum muff 21. Furthermore, the vacuum space is sealed by a rubber gasket 20. The high-voltage part 19 is on the head of the device, as well as a connecting block 18 which leads to a light guide 17. The light guide leads to a photocell which makes available the electric current for Peltier elements for the additional cooling.

Typical elements for the construction of such a cooling cell are: electric source of voltage 6 V; wiring, potentiometer and two switches (voltage switch, switch for grid control); electrodes; coatings; heat dissipating sheets for the anode; insulation of the proper cooling cell; adaptive connections with the cathodic side for the proper cooling space; transformation unit of the anodic current for storing purposes or for transformations of the electric energy into cold; regulating circuit for control electrode; optical display unit for cooling activity; temperature measurement.

Figure 3:
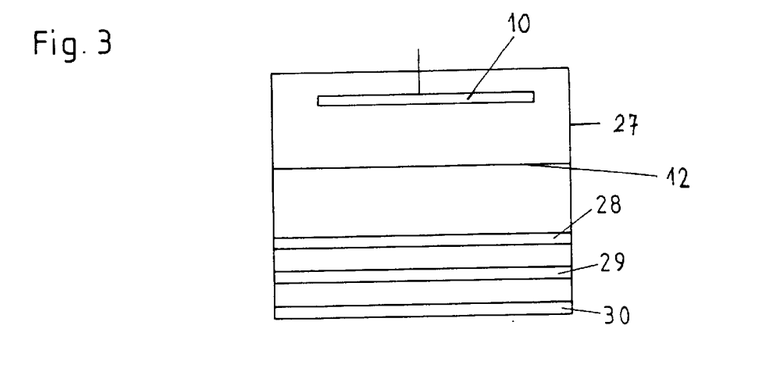
FIG. 3 shows a special layer structure of the cooling system.

A possible layer structure is represented in FIG. 3 for which various heat active layers are placed as sandwich combinations which can be active over bigger temperature ranges. The suction electrode 10 is arranged as an anode inside the cell wall 27. Furthermore, a Cs electrode 28 and a Ba electrode 29 exist as an electron emission layer. The heat bottom of the device is designated by 30. The coating 29 can be used for the normal cooling stage, thus for temperatures of 120° C. to room temperature. The second coating 28 would then be available for a further reduction of the temperatures by means of electron emissions of the cesium.

The cooling capacity of the cooling system according to the invention will be explained below with reference to the FIGS. 4 to 6.

Figure 4:
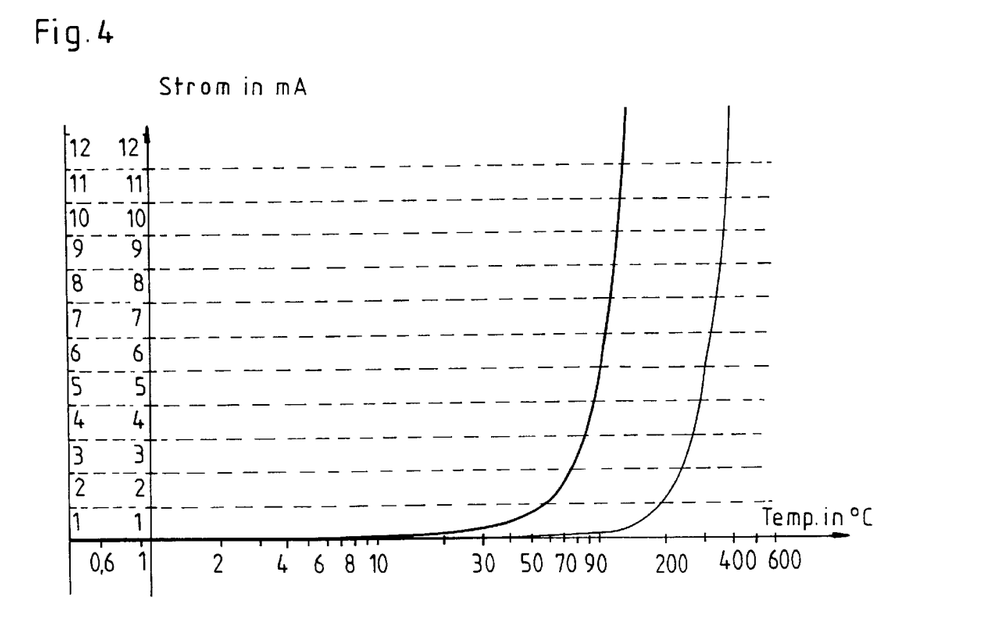
FIG. 4 shows the cooling flow of a cooling device with Ba on W depending on the loss temperature.

FIG. 4 shows the cooling flow of the cooling system with an electron emission layer of barium on tungsten depending on the loss temperature $T_v$ (horizontal axis). As you may clearly recognize, the cooling flow (in mA, vertical axis) with the square of the temperature, i.e. that the cooling self-activates with increasing heating. The left curve shows the relative cooling velocity in the time unit depending on the temperature altitude and has a very strong acending course above 60° C.

Figure 5:
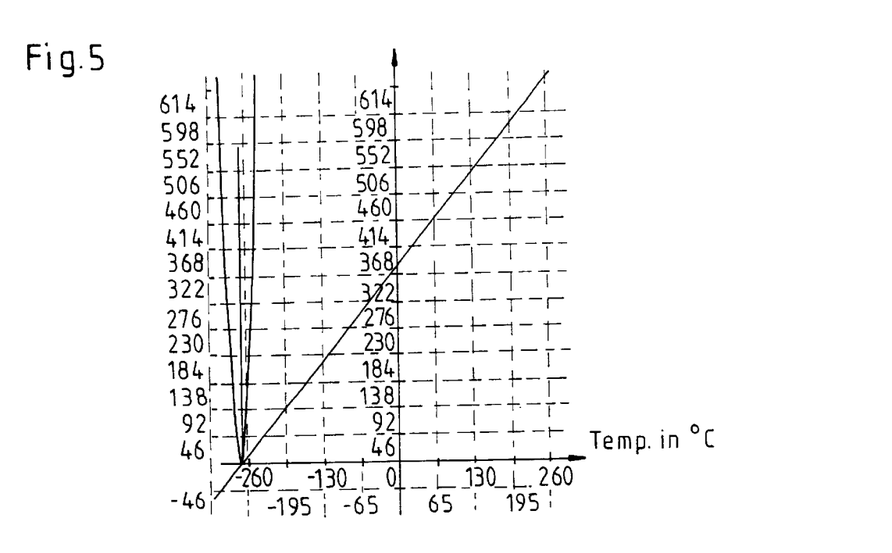
FIG. 5 shows the cooling current of a cooling device with Cs on W depending on the loss temperature.

FIG. 5 contains a similar representation of an active layer of cesium on tungsten. The straight-line cooling curve clearly shows that wide areas are detected in the negative temperature level. This means that the cooling also can also be operative at minus temperatures. The other curve shows the cooling capacity per temperature value. For cesium on tungsten, this cooling capacity increases with a rise factor bigger than 1, this means that the cooling increases exponentially with the increasing temperature. Compared to Ba on tungsten (FIG. 4), the cooling capacity is more sensitive by three measures and is thus more powerful.

The cooling can be switched-off when the suction voltage at the anode has come to zero or when the negative grid bias voltage is so high that the passage of the anode does not take place any longer. When the potential at the control grid has moved to zero, the heat transports of the electrons are strongly increased, and a strong cooling effect is released. Since this can resulting in icing, the regulation should always start from adjustable electronic limiting values of the temperature control.

Figure 6:
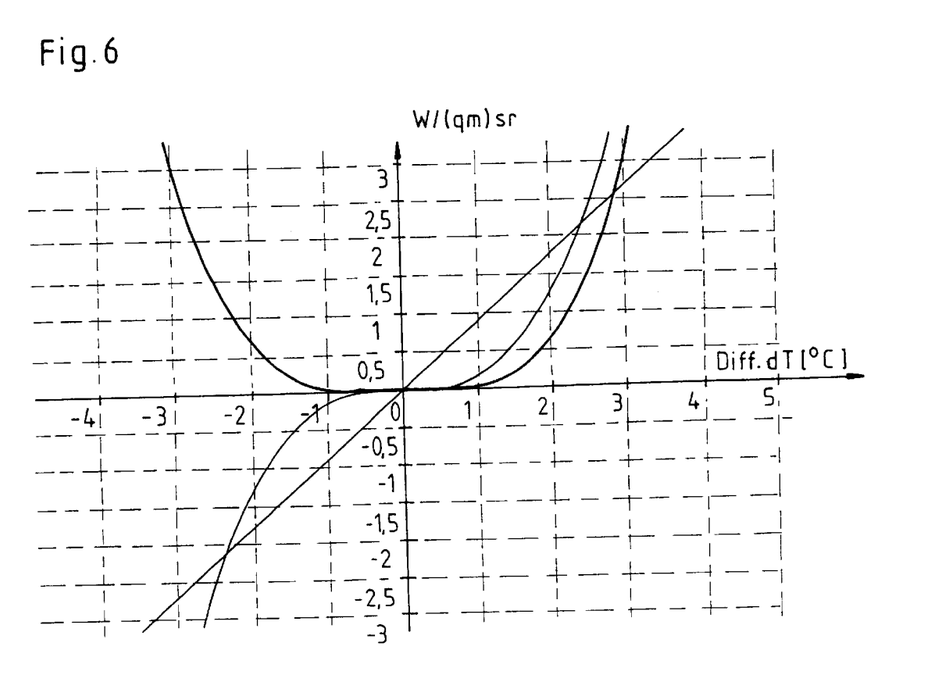
FIG. 6 shows the radiation energy of electron flows on the cathode side depending on the temperature difference.

In FIG. 6, the effect of the regulation to the cooling flows of the free electrons of Cs and their energy which has been carried along is represented. The emission rate $\epsilon$ has been determined with the value of gold since Cs has a similar appearance. It can be recognized that the radiation energy (vertical axis, unit $W/m^2 sr$) rises as a parabole with the temperature (horizontal axis). The energy transfer runs thus potentially with increasing temperature, whereby the spectral reradiation per temperature unit is approximately proportional to the energy transport of the electrons (curve of the first derivative). The bigger the variation of the spectral cooling on the cathode side per temperature value, the higher the energy to be absorbed (curve of the second derivative).

It is advantageous for the emission process when a big surface is made available for the released electrons. The cooling effect exponentiates with the surface enlargement. The structuration can be configured in such a way that peaks and curves of 1 to 2 $\mu$m height produce edges so that the work of emission is reduced by several orders of magnitude. By using tungsten as a polarizing base for the active layer, approximately 0,3 eV are required, whereby the use of barium alone requires 2,52 eV for the electron emission. By using Cs alone, 1,94 eV are required, in connection with the support tungsten only 0,001 eV.

Figure 7:
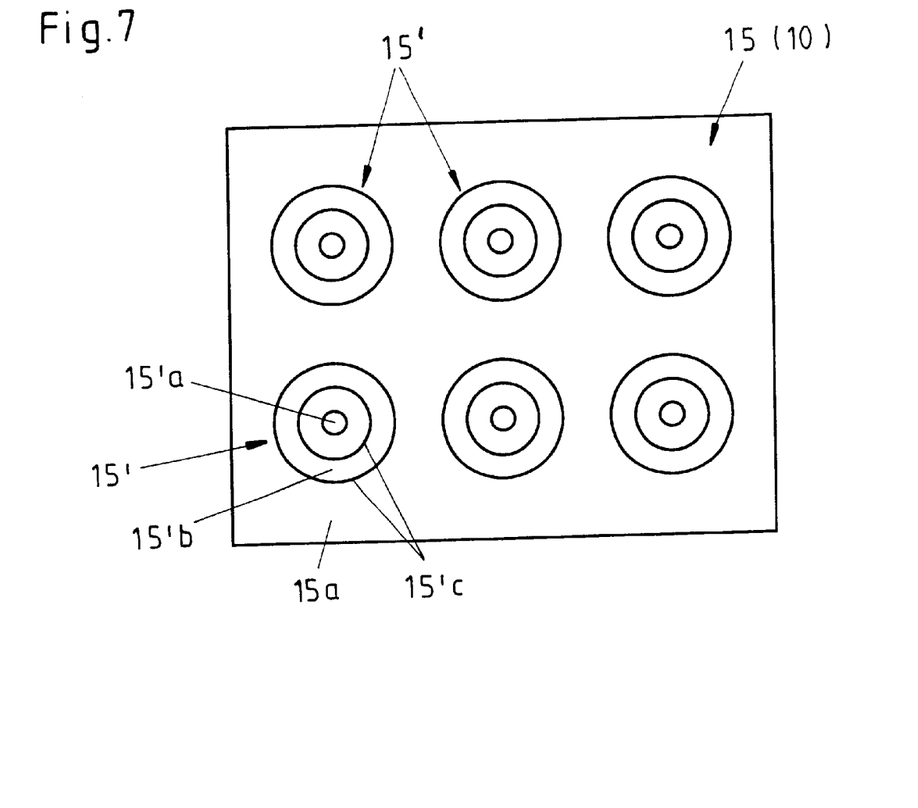
FIG. 7 shows a schematic representation of the surface of an electron emission layer with a surface profile shaping.

The surface of the electron emission layer 15 has a surface profile shaping for enlarging the surface and for making easier an electron emission from the electron emission layer. This surface profile shaping of the electron emission layer 15 is made of pointed raised projecting parts or of crater-shaped profiles 15' with annular elevations 15'a and annular recesses 15'b, whereby at the transitions forming edges between the annular elevations 15'a and the annular recesses 15'b edge effects are induced in such a way that an increased electrode emission is obtained on the edges 15'c (FIG. 7). The surface profile shaping can also be made of points of pyramidal moulded bodies, these points being configured on the surface of the electron emission layer 15. Edge effects which reduce the electron emission energy by further two orders of eV are also induced with the aid of the surface made of peaks. The formed surface structures can also be covered with a thin film made of a correspondingly appropriate metallic component.

Figure 8:
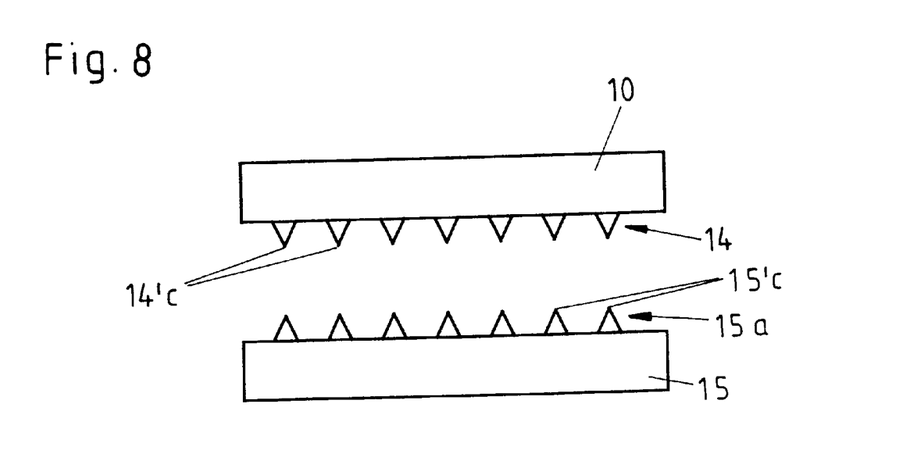
FIG. 8 shows a side view of a suction electrode and of the electron emission layer with facing surface profiles.

The surface of the suction electrode 10 can also be provided correspondingly with a surface profile shaping just as the electron emission layer 15 can also be provided with a surface profile shaping (FIG. 8). The suction electrode 10 has similar surface structures as the electron emission layer 15. The suction electrode body can also be coated correspondingly for constituting a structure; it is essential that an edge formation is created in order to achieve an increased electrode emission. The electron emission layer and the suction electrode 10 have the same surface structures which are formed on their opposing surfaces (FIG. 8). The suction electrode 10 as an anode should have a special suction edge conformation in order to make possible the intensive electron discharge from the hot cathode (electron emission layer) and the shortest way from the cathode to the anode. The structure surface of the suction electrode 10 is designated in FIG. 8 by 14 and the edge formation with 14'c. A similar surface structure 15a of the electron emission layer 15 is opposed to this, the edges of which are designated by 15'c in FIG. 8.

Reference Numerals
100 Cooling device
10 Suction electrode (anode)
11 Suction profile shaping
12 Control grid
13 Electrons
14 Structure surface
14' Edges
15 Electron emission layer (cathode)
15' Crater-shaped profiles
15'a Annular elevations
15'b Annular recesses
15'c Edges
15a Structure surface
16 Battery
17 Light guide
18 Connecting block
19 High-voltage part
20 Rubber gasket
21 Vacuum muff
22 Heat conducting bodies
23 Reaction space
24 Heat intercepting surface
25 Heat field
26 Source of heat
27 Cell wall
28 Cs-electrode
29 Ba-electrode
30 Heat bottom

What is claimed is:

1. A cooling device (100) comprising an electron emission layer (15) to be applied on the object to be cooled, a suction electrode (10) placed at a distance of the electron emission layer as well as a source of voltage (16), the negative pole of which is connected with the electron emission layer and the positive pole thereof with the suction electrode, wherein at least one grid (12), which is connected with an adjustable source of voltage, is placed between the electron emission layer (15) and the suction electrode (10).

2. A cooling device according to claim 1, wherein the surface of the electron emission layer (15) contains electrides or an alkaline earth metal, preferably cesium or barium.

3. A cooling device according to claim 2, wherein the surface of the electron emission layer (15) is placed on a layer which contains tungsten.

4. A cooling device according claim 1, wherein the surface of the electron emission layer (15) has a surface profile shaping for enlarging the surface and for making easier an electron discharge from the electron emission layer (15).

5. A cooling device according to claim 4, wherein the surface of the electron emission layer (15) has a three-dimensional structure (14), preferably through configuration of recesses and/or elevations.

6. A cooling device according to claim 4, wherein the surface profile shaping of the electron emission layer (15) is made of pointed raised projecting parts or of crater-shaped profiles (15') with annular elevations (15'a) and annular recesses (15'b), whereby at the transitions forming edges (15'c) between the annular elevations (15'a) and the annular recesses (15'b) edge effects are induced in such a way that an increased electrode emission is obtained on the edges (15'c).

7. A cooling device according to claim 1, wherein there is a vacuum between the electron emission layer (15) and the suction electrode (10).

8. A cooling device according to claim 1, wherein it has a device for generating a magnetic field in the area of the surface of the electron emission layer (15).

9. A cooling device according to claim 1, wherein the electron emission layer (15) contains radioactive elements which are subject to a β-decay.

10. A cooling device according to claim 1, wherein the electron emission layer (15) is configured as a thin-layer film on a highly conductive material, preferably on gold.

11. A cooling device according to claim 1, wherein the suction electrode (10) has correspondingly to the electron emission layer (15) a surface profile shaping for enlarging the surface and for making easier an electron discharge from the electron emission layer (15).

12. A cooling device according to claim 11, wherein the suction electrode (10) has projecting parts (11) which make easier an electron discharge from the electron emission layer (15).

13. A method for cooling an object, comprising placing an electron emission layer (15) on the object and placing a suction electrode (10) at a distance of the electron emission layer, feeding the electron emission layer (15) opposite the suction electrode (10) to a negative electric potential, placing a grid (12) between the electron emission layer (15) and the suction electrode (1a) and controlling the flow of the electrons (13) from the electron emission layer to the suction electrode by an electric potential fed to the grid.

14. A cooling system containing a secondary cooling, in particular in form of a convection cooling, comprising a cooling device (100) to be applied on the object to be cooled, the cooling device (100) comprising an electron emission layer (15) to be applied on the object to be cooled, a suction electrode (10) placed at a distance of the electron emission layer as well as a source of voltage (16), the negative pole of which is connected with the electron emission layer and the positive pole thereof with the suction electrode, wherein at least one grid (12), which is connected with an adjustable source of voltage, is placed between the electron emission layer (15) and the section electrode (10), wherein, the suction electrode (10) is cooled by the secondary cooling.

* * * * *